(12) United States Patent
Keeth

(10) Patent No.: US 6,317,358 B1
(45) Date of Patent: Nov. 13, 2001

(54) EFFICIENT DUAL PORT DRAM CELL USING SOI TECHNOLOGY

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/632,265

(22) Filed: Aug. 3, 2000

(51) Int. Cl.$^7$ ................................. G11C 11/24
(52) U.S. Cl. ..................... 365/149; 365/52; 365/63; 365/230.05
(58) Field of Search .................. 365/149, 150, 365/230.05, 51, 52, 63, 72; 257/296

(56) References Cited

U.S. PATENT DOCUMENTS

| | | | |
|---|---|---|---|
| 4,578,780 | * | 3/1986 | Baba ................. 365/149 |
| 4,999,811 | * | 3/1991 | Banerjee .............. 365/149 |
| 5,007,022 | * | 4/1991 | Leigh ................. 365/149 |
| 5,327,375 | * | 7/1994 | Harari ................ 365/149 |
| 5,535,172 | | 7/1996 | Reddy et al. ......... 365/230.03 |
| 5,804,495 | | 9/1998 | Saito et al. .......... 438/459 |
| 5,864,181 | | 1/1999 | Keeth ................. 257/776 |
| 5,923,593 | | 7/1999 | Hsu et al. ........... 365/189.04 |
| 6,137,716 | * | 10/2000 | Wik ................... 365/149 |

OTHER PUBLICATIONS

H. Hoenigschmid et al., "A 7F$^2$ Cell and Bitline Architecture Featuring Titled Array Devices and Penalty–Free Vertical BL Twists for 4Gb DRAM's", 1999 Symposium on VLSI Circuits Digest of Technical Papers, pp. 125–126.
800 Mb/s/pin SLDRAM, 1999, pp. 1–32.

* cited by examiner

*Primary Examiner*—Tan T. Nguyen
(74) *Attorney, Agent, or Firm*—Dickstein Shapiro Morin & Oshinsky LLP

(57) ABSTRACT

A dual port memory cell having reduced architecture utilizing silicon on insulator is provided. Each storage capacitor has respective access transistors, for connecting the storage capacitor to two separate digit lines. One of the access transistors connects the capacitor to a first digit line which runs above the silicon on insulator layer while the second access transistor connects the capacitor to a second digit line which runs below the silicon on insulator structure.

37 Claims, 5 Drawing Sheets

EFFICIENT DUAL PORT DRAM CELL USING SOI TECHNOLOGY

FIELD OF THE INVENTION

The present invention relates to dynamic random access memory ("DRAM") cells, particularly to a dual port DRAM cell having reduced architecture utilizing silicon on insulator ("SOI") structure.

DISCUSSION OF THE RELATED ART

As the data processing speed of computer systems increase, the need for faster memory speeds also increases. Conventional (or single port) DRAMs, due to their high density and relatively low manufacturing cost, are presently used for the majority of memory applications. Conventional DRAMs, however, are not feasible for many growing memory applications. While cost effective, conventional DRAMs have a lower operating speed relative to other memory types.

In a typical single port configuration, as shown in FIG. 1, a DRAM cell 100 consists of an access transistor 101, a storage capacitor 120, a digit line 111 and a wordline 106. During a write access, a wordline enable signal is asserted on wordline 106 thereby turning on transistor 101. A data signal is provided on digit line 111. This signal is routed through transistor 101 and stored in capacitor 120. During a read access, a wordline enable signal is asserted on wordline 106 to turn on transistor 101. The data signal stored in capacitor 120 is routed to digit line 111 through transistor 101. This data signal is amplified by a sense amplifier (not shown) and then provided to the device initiating the read access.

As noted, the single port cell DRAM illustrated in FIG. 1 while having many advantages is relatively slow. As a result, faster memory devices have been developed which include dual-port DRAMs (called video RAMs, or VRAMs, in some instances). Dual-port DRAMs provide speed advantages over conventional DRAMs by providing an additional input/output port to the memory array. In conventional DRAMs, read and write operations may never occur simultaneously, as both operations occur through a single random access port, as discussed above. In contrast, in a dual-port DRAM, the second port (most often a serial port) is provided in addition to the random access port. Data is read and written by transferring an entire array row at one time between a serial shift register and the array.

FIG. 2 is a schematic diagram of a conventional dual-port DRAM cell 200. Cell 200 consists of write access transistor 201, read access transistor 202 and storage capacitor 220. The operation of cell 200 is similar to that of single port DRAM cell 100, except the read and write accesses are performed at two separate dedicated ports. The write port is defined by the write digit line 211 and write wordline 206. The read port is defined by the read digit line 212 and read wordline 205.

During a write access, a write wordline enable signal is asserted on write wordline 206, thereby turning on write transistor 201. A data signal is provided to capacitor 220 through write digit line 211 and write transistor 201. During a read access, a read wordline enable signal is asserted on read wordline 205. If a logic high data value is stored in capacitor 220, read transistor 202 turns on and the logic high wordline enable signal on read wordline 205 is transmitted to read digit line 212. If a logic low data value is stored in the capacitor 220, transistor 202 is not turned on, and read digit line 212 is left floating (i.e. at a logic low value).

However, even though dual port DRAMs have higher operating speeds, their cells are more complex in design and are larger in size relative to a conventional single port DRAM cell. Typically, a dual port DRAM cell occupies 16 square features ($F^2$). Hence, what is needed is a dual port DRAM with a reduced structure size.

SUMMARY OF THE INVENTION

The present invention proposes a dual port DRAM SOI structure with reduced architecture of no more than 8 $F^2$ by utilizing two separate metallization layers above and below an upper surface of the silicon on insulator layer.

In a memory cell of the invention, each storage capacitor is connected by an associated access transistor, to one of two bit lines. Thus, a first access transistor connects the capacitor through an upper bit line contact to a first digit line which runs above the upper surface of the silicon on insulator layer while a second access transistor connects the capacitor through a lower bit line contact to a second digit line which runs below the upper surface of the silicon on insulator layer.

The above advantages and features of the invention will be more clearly understood from the following detailed description which is provided in connection with the accompanying drawings.

DETAILED DESCRIPTION OF THE INVENTION

Figure 1:
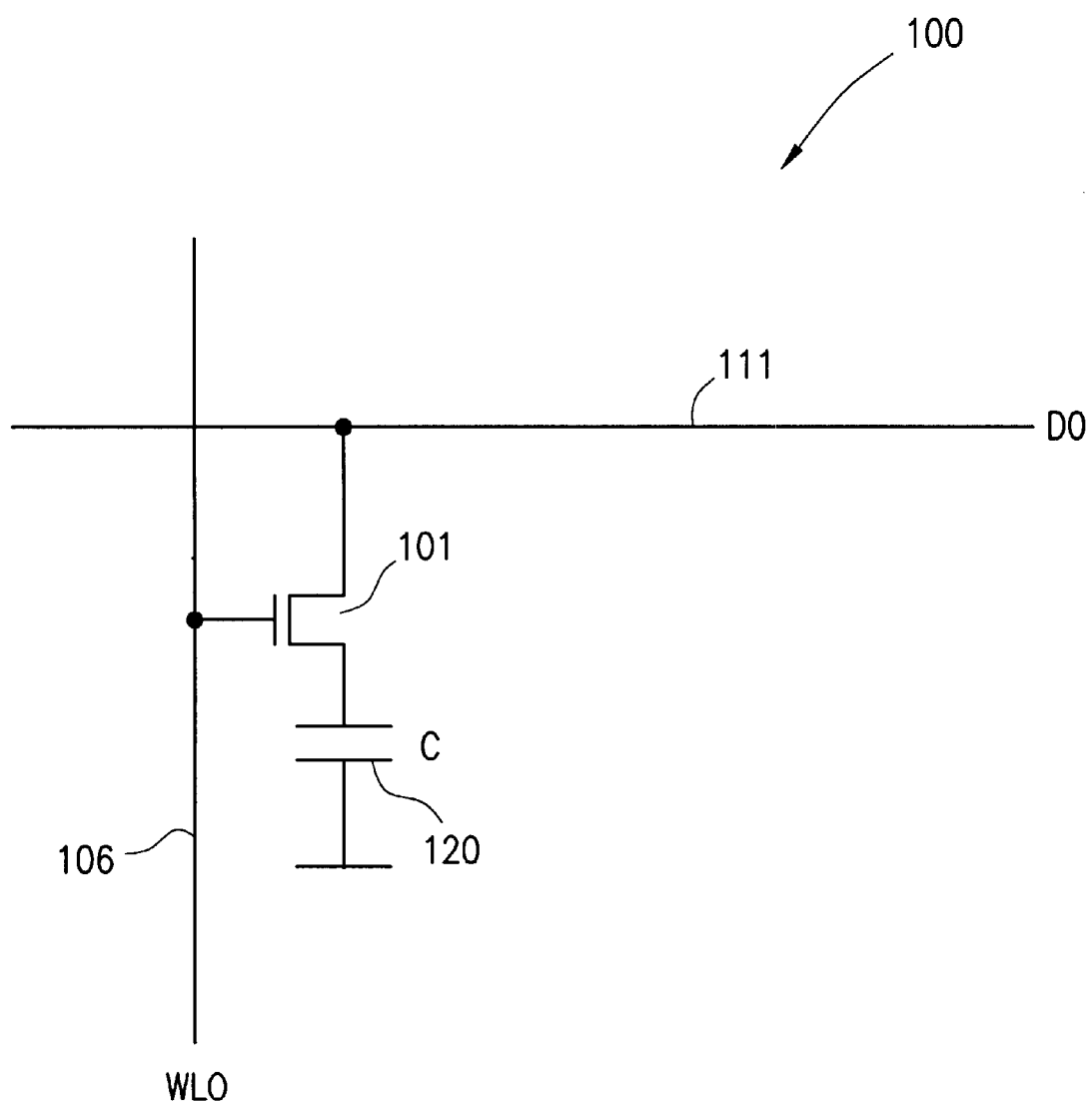
FIG. 1 illustrates a schematic of a single port memory cell.
Figure 2:
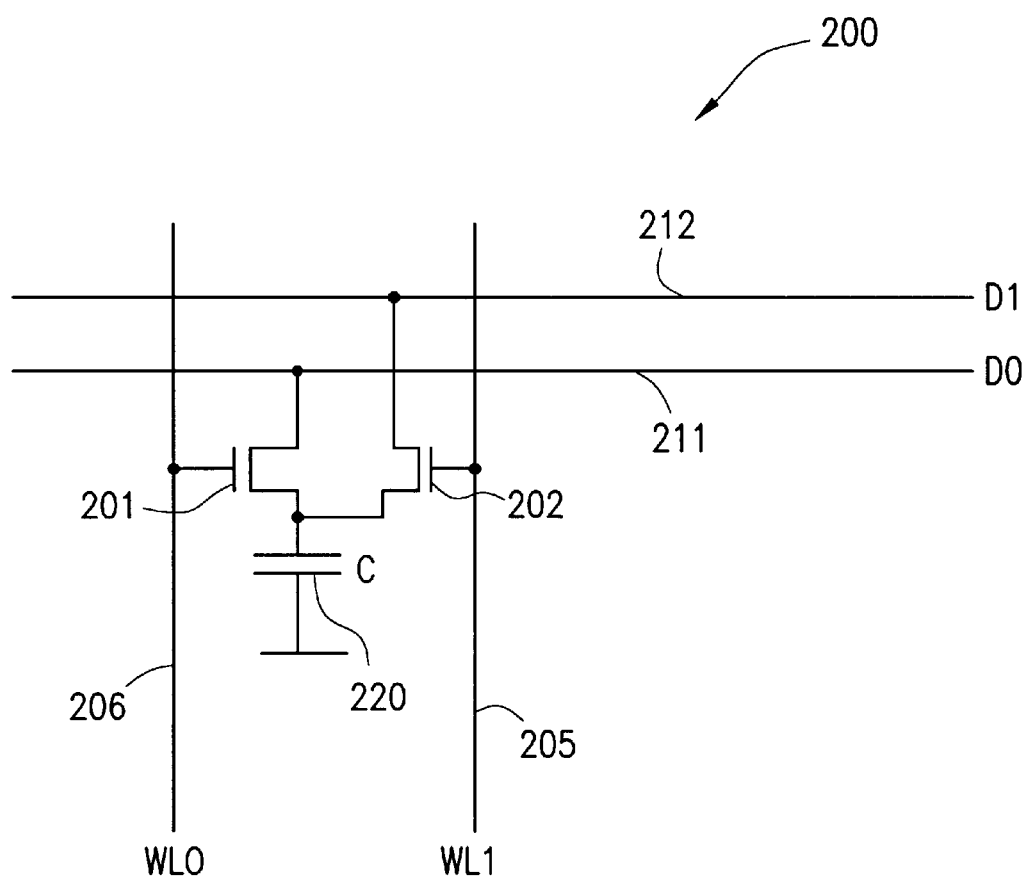
FIG. 2 illustrates a schematic of a dual port memory cell.
Figure 3:
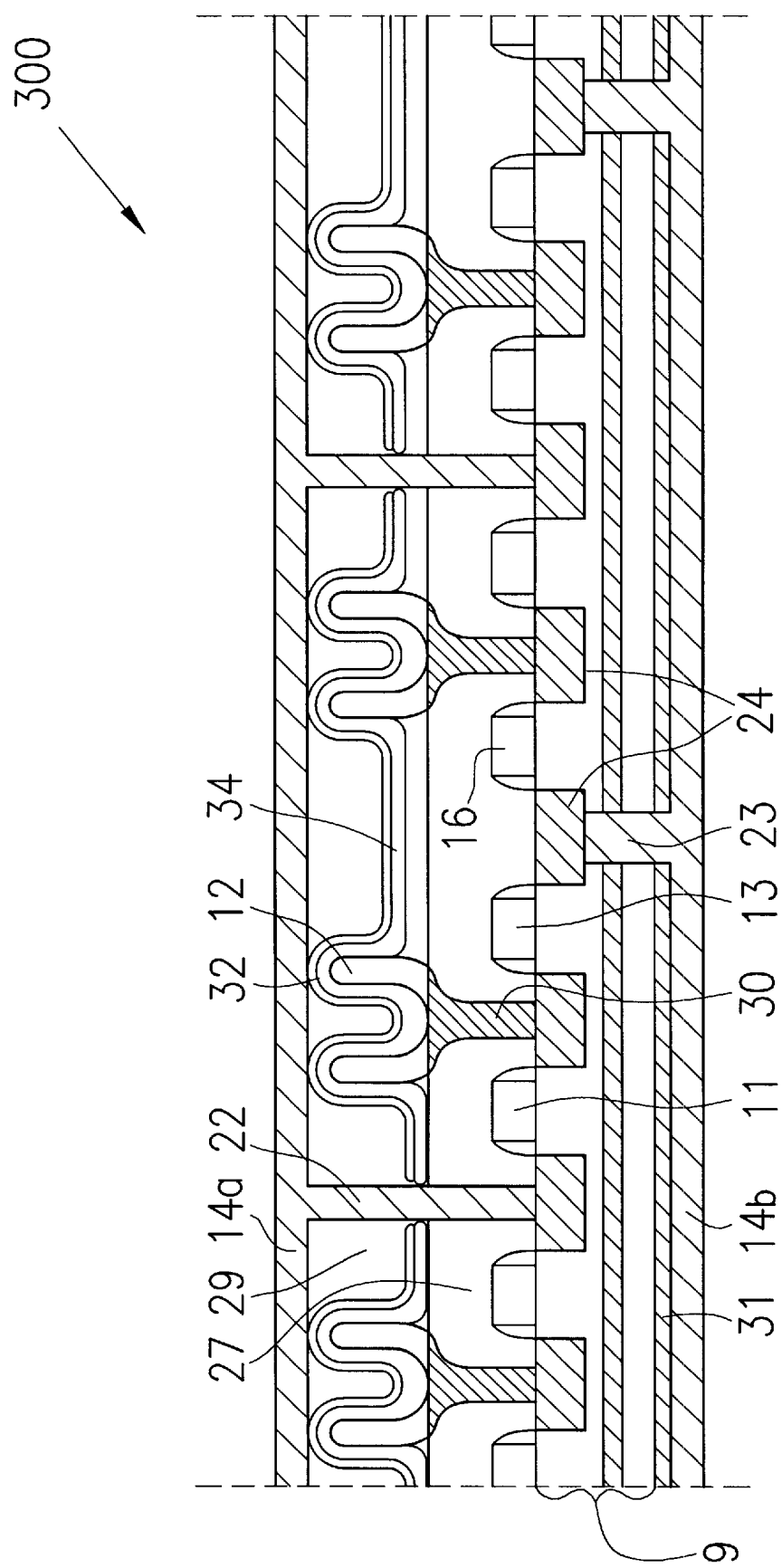
FIG. 3 illustrates a cross-sectional view of an exemplary embodiment of a dual port memory cell in accordance with the present invention.

The present invention will be described as set forth in FIGS. 3–5. Other embodiments may be utilized and structural or logical changes may be made without departing from the spirit or scope of the present invention. Although the invention is illustrated in the drawings in connection with dual port DRAM cells, the invention may also be practiced using any multi-port memory cell as well. Like items are referred to by like reference numerals throughout the drawings.

The term SOI used in the following description may include any silicon-on-insulator structure that has an exposed silicon surface. Structure must be understood to include, any SOIs fabricated by techniques such as bonded wafer method, SIMOX (separation by implanted oxygen), FIPOS (full isolation by oxidized silicon), laser recrystallization method, and lateral epitaxial method. When reference is made to SOI in the following description, previous process steps may have been utilized to form regions or junctions in or on the base semiconductor layer or foundation.

Although it will be appreciated that additional techniques can be used to measure memory cell sizes which may produce different results from the technique described and used to determine cell size herein, the intended definition of feature is minimum realizable process dimension, but in actual fact equates to a dimension that is half of the wordline (row) and/or digit line (column) pitch.

An exemplary embodiment of the invention is now illustrated in connection with FIGS. 3, 4 and 5. FIG. 3 shows a cross section of the dual port DRAM cells 300 of the present invention. An array of dual port DRAM cells 300 are built from orthogonal stripes of active area 24 and wordline polysilicon 16. This memory cell, employing a buried capacitor structure, places the digit lines 14a, 14b physically above and below the storage capacitor 12, respectively and above and below the upper surface of the SOI layer 9. The digit lines 14a and 14b are constructed from either metal or polysilicon and digit line contacts 22, 23, formed using metal or a polysilicon plug through insulating layers 27–29 (for contact 22) and SOI layer 9 and insulating layer 31 (for contact 23) are used to connect the digit lines 14a and 14b to respective access transistors 11 and 13. The memory cell capacitor 12 is formed with polysilicon (poly2) 30 connected to a polysilicon bottom cell plate, an oxide-nitride-oxide (ONO) dielectric 34, and a sheet of polysilicon (poly3) 32 which forms the common node shared by all memory cell capacitors 12. The capacitor shape can be simple, such as a rectangle, or complex, such as concentric cylinders or stacked discs. Many other materials can also be used in place of those used for the poly plug 30, polysilicon cell plates and dielectric, as well known in the art.

Each storage capacitor 12 has on its opposite sides, separate access transistors. One of the access transistors utilizing gate 11 connects through an upper bit line contact 22 to the upper digit line 14a which runs above the upper surface of the SOI layer 9. The second access transistor utilizing gate 13 connects through a lower bit line contact 23 to a second digit line 14b which runs below the upper surface of the SOI layer 9. In other words, capacitor 12 is connected, during one of a read and write operation, to a first bit line contact 22 and then to a second bit line contact 23, during the other of a read and write operation, with the second bit line contact 23 being spatially located in a plane of the memory cell 300 which is different from a plane of the memory cell 300 in which the first bit line contact 22 is located. Hence, by fabricating the DRAM array utilizing two separate metallization layers (14a, 14b) above and below the upper surface of the SOI layer, the overall cell size is reduced by two linear features (one width and one space) such that the final cell size is eight square features ($8F^2$) instead of sixteen square features ($16F^2$).

Figure 4:
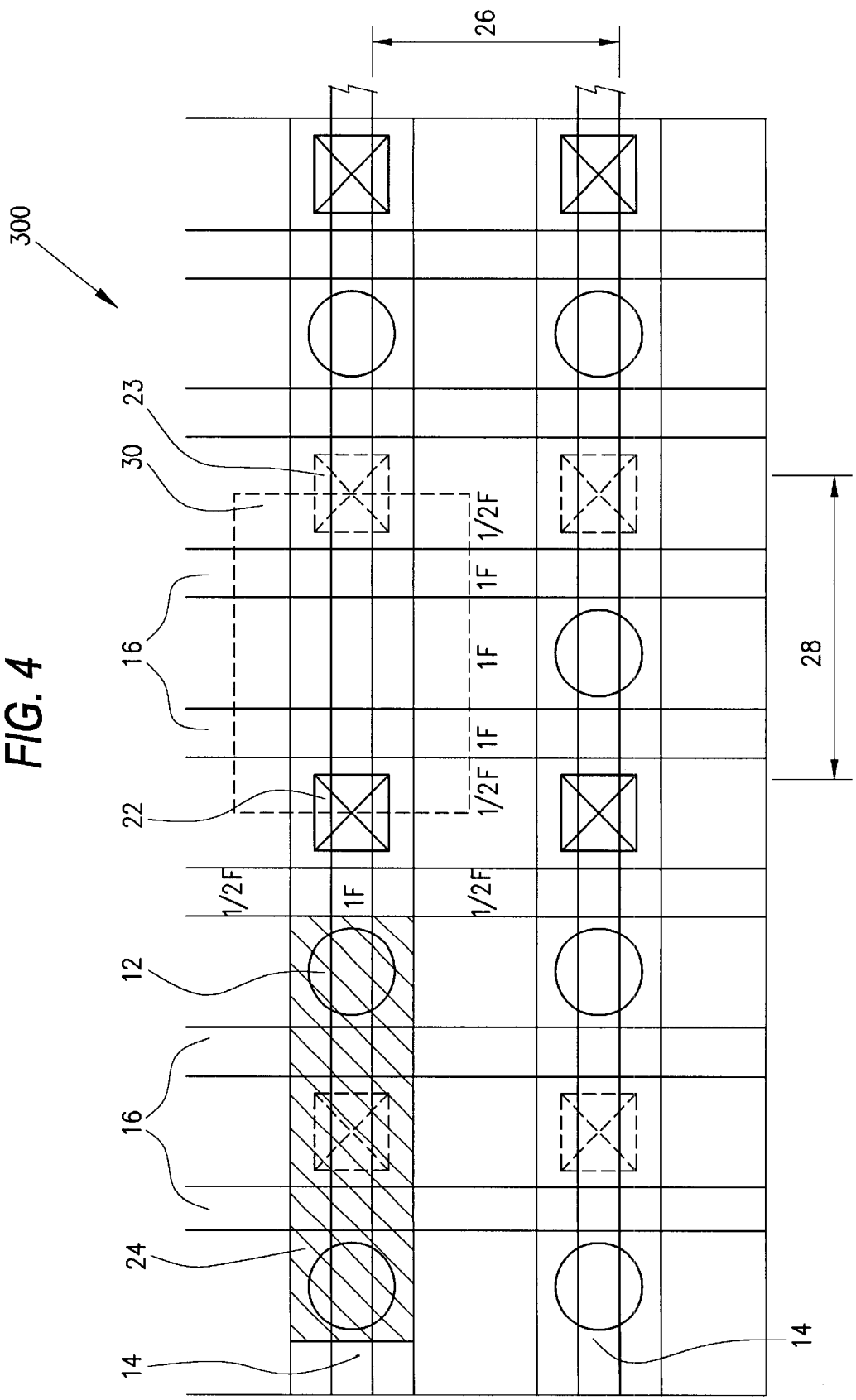
FIG. 4 illustrates a top-plan view of the FIG. 3 embodiment.

FIG. 4 shows a top plan view of the dual port DRAM cell of the present invention. As shown, memory cells 300 are constructed in pairs to allow sharing of the digit line contact 22. Sharing a contact significantly reduces overall cell size. The memory cells consist of an active area rectangle 24, a pair of polysilicon wordlines 16, a single digit line contact 22, a metal or polysilicon digit line 14, and cell capacitors 12 formed with oxide-nitride-oxide dielectric between two layers of polysilicon. For some processes, the wordline polysilicon is silicided to reduce the sheet resistance, permitting longer wordline segments without reducing speed.

The digit line pitch 26 (width plus space) dictates the active area pitch and capacitor pitch. The active area width and the field oxide width are set to maximize transistor drive and minimize transistor to transistor leakage. The field oxide technology greatly impacts this balance. A thicker field oxide or a shallower junction depth will enable wider transistor active area. Also, the wordline pitch 28 (width plus space) dictates the space available for the digit line contact, transistor length, active area space, poly width, and capacitor length.

An imaginary box 30 drawn around the memory bit defines the cell's outer boundary. Along the x-axis, this box will include ½ digit line contact feature, 1 wordline feature, 1 capacitor feature, 1 wordline feature, and ½ digit line contact feature, which totals to 4 features. Along the y-axis, this box contains two ½ field oxide features and 1 active area feature, which totals to 2 features. Hence, the area of the memory bit is, as defined herein, $(4F*2F)=8\ F^2$. Thus, for example, a 0.25 μm process having wordline and digit line pitches of 0.6 μm yields a memory bit size that is $8(0.3\ \mu m)^2=0.72\ \mu m^2$.

Hence, by fabricating the DRAM array utilizing two separate metallization layers (14a, 14b), above and below the access transistors (and above and below the SOI layer), the overall cell size is reduced by two linear features (one width and one space) such that the final cell size is eight square features ($8F^2$).

Figure 5:
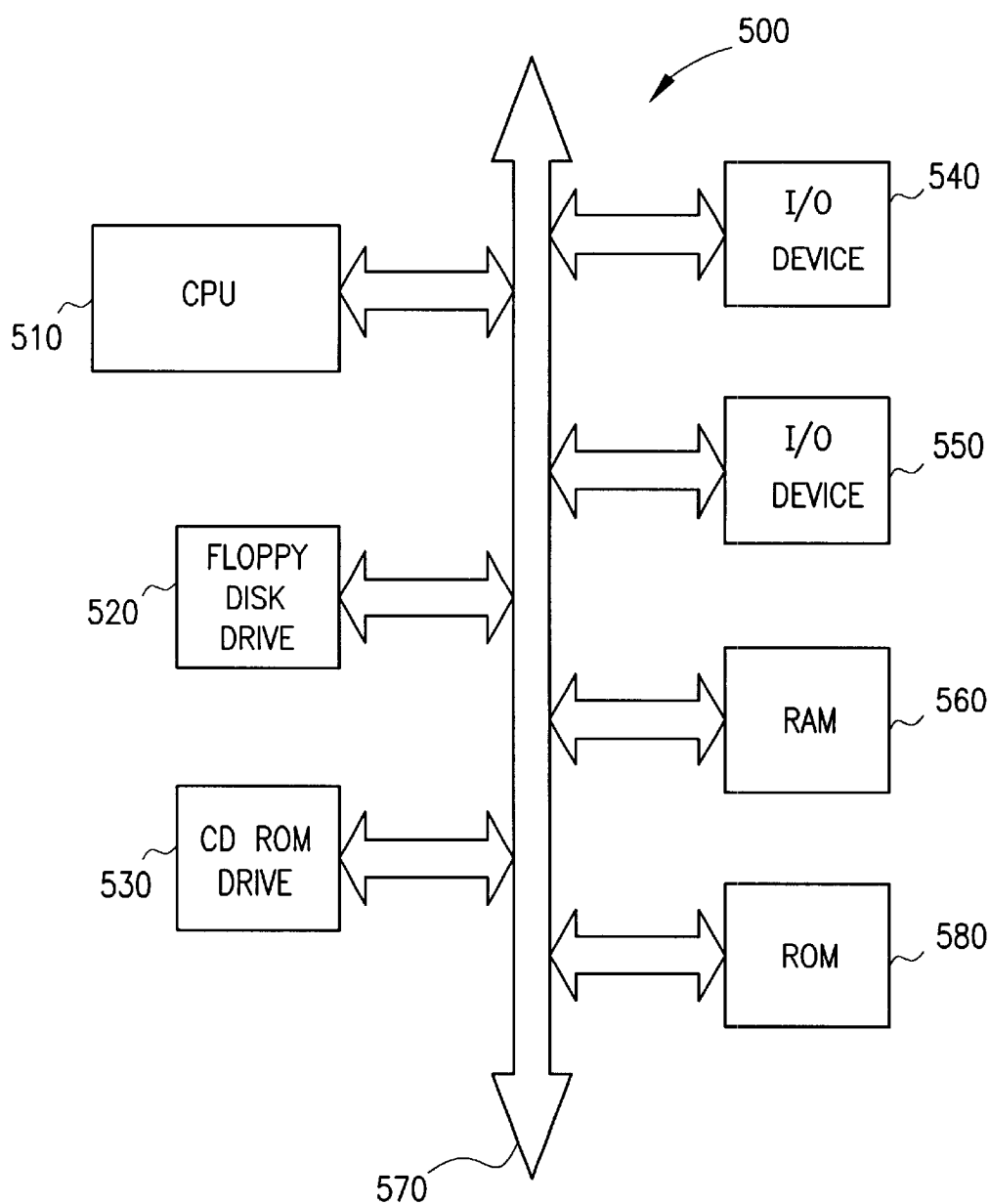
FIG. 5 illustrates a processor based system utilizing the exemplary embodiment of the present invention.

A processor system which may employ the dual port memory cell of the invention is illustrated in FIG. 5. As shown in FIG. 5, the processor system, such as a computer system, for example, comprises a central processing unit (CPU) 510, for example, a microprocessor, that communicates with one or more input/output (I/O) devices 540, 550 over a bus 570. The computer system 500 also includes random access memory (RAM) 560, a read only memory (ROM) 580 and may include peripheral devices such as a floppy disk drive 520 and a compact disk (CD) ROM drive 530 which also communicates with CPU 510 over the bus 570. The RAM 560 may be constructed as an integrated circuit which includes the dual port DRAM cell 300 as described above. It may also be desirable to integrate the processor 510 and memory 560 on a single IC chip.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A multi-port memory cell comprising:

a capacitor fabricated above a substrate;

a first transistor fabricated over said substrate and controllably connecting said capacitor to a first digit line;

a second transistor fabricated over said substrate and controllably connecting said capacitor to a second digit line; and said first digit line being above said transistors and said second digit line being below said transistors.

2. The memory cell of claim 1 wherein said memory cell size comprises a maximum area of eight square feature size ($8F^2$).

3. The memory cell of claim 1 wherein said substrate is a silicon-on-insulator substrate.

4. The memory cell of claim 1 wherein the first and second digit lines are formed of a metal.

5. The memory cell of claim 1 wherein the first and second digit lines are formed of a polysilicon.

6. The memory cell of claim 1 wherein said transistors are fabricated to be on opposite lateral sides of said capacitor.

7. The memory cell of claim 1 wherein said memory cell comprises a dual port random access memory cell.

8. The memory cell of claim 1 further comprising bit line contacts for connecting said transistors to said digit lines.

9. A multi-port memory cell comprising:

a pair of transistors fabricated over a substrate and provided on opposite lateral sides of a capacitor fabricated above the substrate for respectively controllably connecting said capacitor to a first and a second digit line, said first digit line being spatially located in a plane above said capacitor and said second digit line being spatially located in a different plane below said capacitor.

10. The memory cell of claim 9 wherein said planes are located above and below said transistors.

11. The memory cell of claim 9 wherein said planes are located on opposite sides of a silicon on insulator structure.

12. A processor based system comprising:

a central processing unit;

a memory device coupled to said central processing unit to receive data from and supply data to said central processing unit, said memory device having a memory cell comprising:

a capacitor fabricated above a substrate;

a first transistor fabricated over said substrate and controllably connecting said capacitor to a first digit line;

a second transistor fabricated over said substrate and controllably connecting said capacitor to a second digit line; and said first digit line being above said transistors and said second digit line being below said transistors.

13. The system of claim 12 wherein said memory cell size comprises a maximum area of eight square feature size ($8F^2$).

14. The system of claim 12 wherein said substrate is a silicon-on-insulator substrate.

15. The system of claim 12 wherein the first and second digit lines are formed of a metal.

16. The system of claim 12 wherein the first and second digit lines are formed of a polysilicon.

17. The system of claim 12 wherein said transistors are fabricated to be on opposite lateral sides of said capacitor.

18. The system of claim 12 wherein said memory cell comprises a dual port random access memory cell.

19. The system of claim 12 further comprising bit line contacts for connecting said transistors to said digit lines.

20. The system of claim 12 wherein said processor and said memory device is located on the same chip.

21. A memory device comprising:

a memory array containing a plurality of memory cells, each of said memory cells comprising:

a capacitor fabricated above a substrate;

a first transistor fabricated over said substrate and controllably connecting said capacitor to a first digit line;

a second transistor fabricated over said substrate and controllably connecting said capacitor to a second digit line; and said first digit line being above said transistors and said second digit line being below said transistors.

22. The memory device of claim 21 wherein said memory cell size comprises a maximum area of eight square feature size ($8F^2$).

23. The memory device of claim 21 wherein said substrate is a silicon-on-insulator substrate.

24. The memory device of claim 21 wherein the first and second digit lines are formed of a metal.

25. The memory device of claim 21 wherein the first and second digit lines are formed of a polysilicon.

26. The memory device of claim 21 wherein said transistors are fabricated to be on opposite lateral sides of said capacitor.

27. The memory device of claim 21 wherein said memory cell comprises a dual port random access memory cell.

28. The memory device of claim 21 further comprising bit line contacts for connecting said transistors to said digit lines.

29. A method of forming a multi-port memory device comprising the acts of:

forming a capacitor over a substrate;

forming a first transistor over said substrate which controllably connects said capacitor to a first digit line;

forming a second transistor over said substrate which controllably connects said capacitor to a second digit line; and said first digit line being above said transistors and said second digit line being below said transistors.

30. The method of claim 29 wherein said memory cell size comprises a maximum area of eight square feature size ($8F^2$).

31. The method of claim 29 wherein said substrate is a silicon-on-insulator substrate.

32. The method of claim 29 wherein the first and second digit lines are formed of a metal.

33. The method of claim 29 wherein the first and second digit lines are formed of a polysilicon.

34. The method of claim 29 wherein said transistors are fabricated to be on opposite lateral sides of said capacitor.

35. The method of claim 29 wherein said memory cell comprises a dual port random access memory cell.

36. The method of claim 29 further comprising forming bit line contacts for connecting said transistors to said digit lines.

37. A method of operating a multi-port memory cell comprising the acts of:

connecting a storage capacitor during one of a read and write operation to a first bit line;

connecting said storage capacitor during the other of a read and write operation to a second bit line;

said second bit line being spatially located in a plane of said memory cell which is different from a plane of said memory cell in which said first bit line is located.

* * * * *